United States Patent [19]

Kranzer

[11] Patent Number: 4,495,010

[45] Date of Patent: Jan. 22, 1985

[54] METHOD FOR MANUFACTURING FAST BIPOLAR TRANSISTORS

[75] Inventor: Ditmar Kranzer, Putzbrunn, Fed. Rep. of Germany

[73] Assignee: Siemens Aktiengesellschaft, Berlin and Munich, Fed. Rep. of Germany

[21] Appl. No.: 460,504

[22] Filed: Jan. 24, 1983

Related U.S. Application Data

[63] Continuation of Ser. No. 208,493, Nov. 19, 1980, abandoned.

[30] Foreign Application Priority Data

Nov. 21, 1979 [DE] Fed. Rep. of Germany ....... 2946963

[51] Int. Cl.$^3$ .................... H01L 21/20; H01L 21/265
[52] U.S. Cl. ...................................... 148/175; 29/578; 29/580; 148/1.5; 148/187; 148/188; 148/190; 357/34; 357/49; 357/50; 357/59; 357/90; 357/91
[58] Field of Search ................ 148/1.5, 187, 188, 190, 148/175; 29/578, 580; 357/34, 48, 49, 50, 59, 90, 91

[56] References Cited

U.S. PATENT DOCUMENTS

| | | | |
|---|---|---|---|
| 3,649,387 | 3/1972 | Frentz et al. | 148/190 X |
| 3,664,896 | 5/1972 | Duncan | 148/190 X |
| 3,886,569 | 5/1975 | Basi et al. | 148/190 X |
| 4,127,931 | 12/1978 | Shiba | 29/578 X |
| 4,319,932 | 3/1982 | Jambotkar | 148/1.5 |

OTHER PUBLICATIONS

Ho et al, "Doped Polysilicon Diffusion Source . . . ", I.B.M. Tech. Discl. Bull., vol. 20, No. 1, Jun. 1977, pp. 146–148.

Yeh, T. H., "Self-Aligned Integrated . . . Structures", I.B.M. Tech. Discl. Bull., vol. 22, No. 9, Feb. 1980, pp. 4047–4051.

Murrmann, H., "Modern Bipolar Technology . . . ICS", Siemens Forschungs-und Gitwickl, vol. 5, No. 6, 1976.

Panousis et al, "GIMIC-O-A Low cost Non-Epitaxial . . . Circuits", Intern. Electron Devices MTG, Wash., D.C., 1974, Abstract 2214, pp. 515–518.

Primary Examiner—William G. Saba
Attorney, Agent, or Firm—Herbert L. Lerner; Laurence A. Greenberg

[57] ABSTRACT

Method for manufacturing a fast bipolar transistor, including a semiconductor body having a transistor formed therein including a base contact, an emitter zone, and a base zone, the base zone being subdivided into a first inner subregion disposed below the emitter zone and a second outer subregion including all other base regions and being disposed below the base contact, each of the subregions being separately doped to a given degree. The method for manufacturing the same includes the application of a layer of undoped polysilicon on top of a monocrystalline silicon substrate, and subsequently doping the polysilicon by ion implantation with one or more dopants, such as boron or arsenic, followed by a diffusion process for thermally diffusing the dopants into the silicon substrate, thereby creating emitter and base regions that are very small and thin, so that high frequency operation of the resulting transistor may be attained.

5 Claims, 5 Drawing Figures

METHOD FOR MANUFACTURING FAST BIPOLAR TRANSISTORS

This is a continuation of application Ser. No. 208,493 filed 11/19/80, now abandoned.

The invention relates to fast bipolar transistors as well as to a method for manufacturing the same.

In the manufacture of a fast bipolar transistor, the depths of penetration of the emitter-base junction as well as the width of the base are of decisive importance. The frequently used ion implantation methods for generating bipolar transistors make it possible to realize emitter-base junctions of about 0.3 $\mu$m and base widths of 0.2 $\mu$m. This result has been achieved by optimizing the implantation dose and energy as well as the annealing process. As far as can be seen today, a substantial reduction of these values is not possible with this method.

From Siemens Forschungs-und entwickl.-Ber. vol. 5 (1976), no. 6, "Modern Bipolar Technology for High-Performance ICs" it is known to place the emitter zone in bipolar transistors, as a zone which is as flat as possible, in the semiconductor single crystal by the provision that first, undoped polysilicon is deposited in the emitter contact opening; that then, the polysilicon is doped by means of suitable doping materials, for instance through implantation into the polysilicon layer; and that subsequently, the doping material is brought, by means of thermal diffusion, from the polysilicon into the silicon single crystal and thereby an emitter zone that is as flat as possible is created, i.e., the depth of penetration of the emitter-base pn-junction can be made small. A corresponding measure for the base width, however, is not known. Besides the crystal faults which occur in the base zone through base implantation, the choice of a uniformly suitable doping of the base zone presents considerable difficulties because the base zone below the emitter, namely the inner base portion zone, should yield the best possible current gain and base propagation time, i.e., requires relatively little base doping, while the outer base zone, which extends from the base to the base contact, requires a minimum path resistance, which can be achieved with relatively large base doping. Optimizing the base doping by means of the customary methods therefore encounters technical limitations, so that an improvement with respect to fast bipolar transistors which are made by customary techniques, cannot be indicated.

It is accordingly an object of the invention to provide fast bipolar transistors which overcome the hereinaforementioned disadvantages of the heretofore-known devices and methods of this general type, and which have high current gain and a short base propagation time for the inner base portion zone, as well as a minimal path resistance and a good cut-off characteristic of the emitter-base diode in the outer base regions which lead to the base contacts.

With the foregoing and other objects in view there is provided, in accordance with the invention, a fast bipolar transistor, comprising a semiconductor body having a transistor formed therein including a base contact, an emitter zone, and base zone, the base zone being subdivided into a first inner subregion disposed below the emitter zone and a second outer subregion including all other base regions and being disposed in particular below the base contact, each of the subregions being separately optimally doped to a given degree.

By decoupling the inner base zone from the outer base region and by separate doping, optimized for each subregion, substantially faster bipolar transistors can be achieved than is possible with the customary techniques.

In accordance with another feature of the invention, the subdivided base zone and separate doping are self-aligned decoupled.

This measure of self-adjusting decoupling of subdivisions into the subregions and the separate doping of these subregions has the advantage that the differently doped subregions can be doped into the semiconductor single crystal with very high positioning accuracy.

In accordance with a further feature of the invention, the semiconductor body is formed of silicon. The use of silicon has the advantage that a large number of technologies for the manufacture of semiconductor components and integrated circuits is available for this purpose, so that the cost for development and testing of semiconductor components manufactured in this manner is substantially lower than for other, not so frequently used semiconductor materials.

In accordance with an added feature of the invention, there is provided an initially updoped polysilicon layer deposited on the silicon semiconductor body in vicinity of the subregions, and at least one doping substance enriching the deposited polysilicon layer, the doping of the subregions being in the form of subsequent thermal diffusion.

It has not been known to date to also place more than one doping material in an initially undoped polysilicon layer and to subsequently diffuse these doping materials into the semiconductor single crystal. The procedure can be used here, for instance, for doping the emitter zone and the inner base zone, to simultaneously incorporate boron and arsenic into a polysilicon layer that is superimposed on the emitter contact with different concentrations. The different diffusion velocities can be used here to advantageously realize very small base widths. A further improvement regarding small base widths can be achieved, while bringing arsenic as well as boron into the polysilicon layer superimposed on the emitter contact, by providing that the arsenic implantation and the boron implantation are separated in time and made at different depths of the polysilicon layer.

In accordance with another mode of the invention, there is provided a method for the manufacture of fast bipolar transistors, which comprises applying an n$\pm$-doped buried-layer diffusion layer over a for instance p-doped silicon semiconductor substrate;

subsequently applying an n-doped eptaxially deposited silicon layer over the semiconductor body;

forming walls extending through the epitaxial layer into one of the buried-layer diffusion layer and the semiconductor substrate for insulating adjacent components;

placing n$\pm$-doped collector diffusions into the epitaxially applied n-doped silicon layer which extend through the epitaxially applied layer into the buried-layer diffusion layer;

or, instead of the buried-layer diffusion and the epitaxially-applied layer, the method comprises forming a collector trough by diffusion or implantation as is described in: Panousis, P. T. and Pritchett, R. L.; GIMIC-O-A Low Cost Non-Epitaxial Bipolar LSI Technology Suitable for Application to TTL Circuits. Internat. Electr. Dev. Meeting, Washington 1974, Abstr. 22/4, pages 515 to 518;

depositing, in sequence, an undoped polysilicon layer, a silicon oxide layer and a silicon nitride layer on the surface of the semiconductor body at given locations where a transistor is to be produced;

selecting base contact locations of a given size, collector contact locations and emitter contact locations;

depositing a photo varnish or photoresist layer on the silicon nitride layer; etching windows which are somewhat larger than the given size into the photo-layer at the base contact locations by photolithography;

subsequently implanting boron with a particle energy which penetrates the silicon nitride and silicon oxide layers down into the polysilicon layer but does not penetrate the photo-layer;

at least partially removing the photo-layer; subsequently etching away the silicon nitride and silicon oxide layers by further photolithography except at the base, emitter and collector contact locations, to at least partially expose the polysilicon layer; and leave the remaining parts thereof unexposed;

subsequently implanting boron again with a particle energy which implants the exposed parts of the polysilicon layer with boron but does not implant the semiconductor body and the parts of the polysilicon layer under the nitride oxide layer;

subsequently oxidizing the exposed parts of the polysilicon layer for structuring, and simultaneously diffusing boron from the polysilicon layer into the semiconductor layers therebelow by the heat caused by the oxidation;

subsequently etching away the silicon nitride and silicon oxide layers at the collector and emitter contact locations by another photo technique while preserving the nitride and oxide layers in vicinity of the base contact locations;

subsequently implanting boron and arsenic into the remaining polysilicon layers with a substantially higher concentration of arsenic than boron, leaving a nitride mask in the base contact locations which is thick enough to keep arsenic ions away from the polysilicon layer therebelow;

producing an inner base region and an emitter zone by bringing arsenic ions and boron ions from the polysilicon layer into the semiconductor single crystal by thermal diffusion; and opening contact points on the doped polysilicon layers, and subsequently applying emitter, base and collector contacts.

In accordance with another mode of the invention, there is provided a method which comprises forming the walls as pn-walls through the epitaxial layer to form a trough with the semiconductor substrate.

In accordance with a concomitant mode of the invention, there is provided a method which comprises forming the walls out of insulating material.

The method according to the invention has various advantages; the fact that ion implantations always take place in polysilicon layers and are thereafter diffused into the semiconductor single crystal by thermal diffusion, has the advantage that no crystal damage is caused in the component by this implantation.

The second boron implantation taking place in the process is self-aligning and includes the advantage of saving expensive mask techniques and at the same time provides high positioning accuracy of the implanted zones.

The fact that the critical profiles, namely the profiles of the emitter region and of the inner base region, come about at the end of the manufacturing process has the advantage that thereafter the semiconductor component is not subjected to temperature stresses and thereby, no widening of the doping profiles obtained in the process occurs.

Other features which are considered as characteristic for the invention are set forth in the appended claims.

Although the invention is illustrated and described herein as embodied in fast bipolar transistors, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
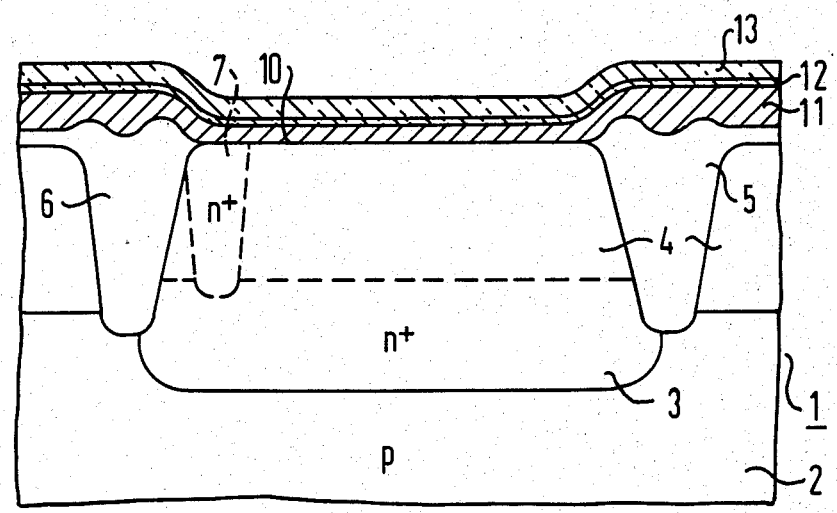
FIG. 1 is a fragmentary, diagrammatic cross-sectional view of a silicon semiconductor body, the surface of which is coated with a layer sequence of polysilicon, silicon oxide and silicon nitride.

Referring now to the figures of the drawing and first particularly to FIG. 1 thereof, there is seen a semiconductor body 1, including a p-doped semiconductor substrate 2, into which an n±-doped zone 3 is diffused and which is provided with an n-doped, epitaxially deposited silicon layer 4. Into the n-doped silicon layer 4, insulator regions 5, 6, formed for instance, of silicon dioxide or undoped polysilicon, are inserted. The insulator regions 5, 6 go entirely through the silicon layer 4 and extend down into the p-doped semiconductor substrate 2 or the n±-doped region 3 and thus generate an insulating trough for a transistor to be formed therein. The function of the insulating regions 5, 6 can be replaced, however, by suitably placed pn-walls which likewise go through the n-doped silicon layer and, together with the p-doped semiconductor substrate 2 form a trough for insulating adjacent components. A component which uses pn-insulating walls may be found, for instance, in Siemens Forsch. and Entw. Ber., vol. 5 (1976), no. 6, "Modern Bipolar Technology for High-Performance ICs", FIG. 1a. That component can be treated analogously instead of the semiconductor bodies shown in FIGS. 1 to 5, so that corresponding transistors according to the invention can be obtained thereby, just as by the embodiment example shown in FIGS. 1 to 5. The same also applies for the manufacture of bipolar transistors by the method described by Panousis, P. T. and Pritchett, R. L.: GIMIC-O-A Low Cost Non-Epitaxial Bipolar LSI Technology Suitable for Application to TTL Circuits, Internat. Electr. Dev.

Meeting, Washington 1974, Abstr. 22/4, Pages 515 to 518, in which a collector trough is generated by means of diffusion or implantation instead of the "buried-layer diffusion". For the purpose of contacting the collector, an n±-doped region 7 is formed extending from the semiconductor surface 10 through the n-doped silicon layer 4 into the n±-doped region. On the semiconductor surface 10, which was first freed of nitride and oxide residues that may have remained from preceding processes, an initially undoped polysilicon layer 11, a silicon oxide layer 12 and silicon nitride layer 13 are deposited in that order.

In FIGS. 2 to 5, all of the parts which agree with parts from FIG. 1 are provided with the same reference numerals as in FIG. 1, and will therefore not be described again.

Figure 2:
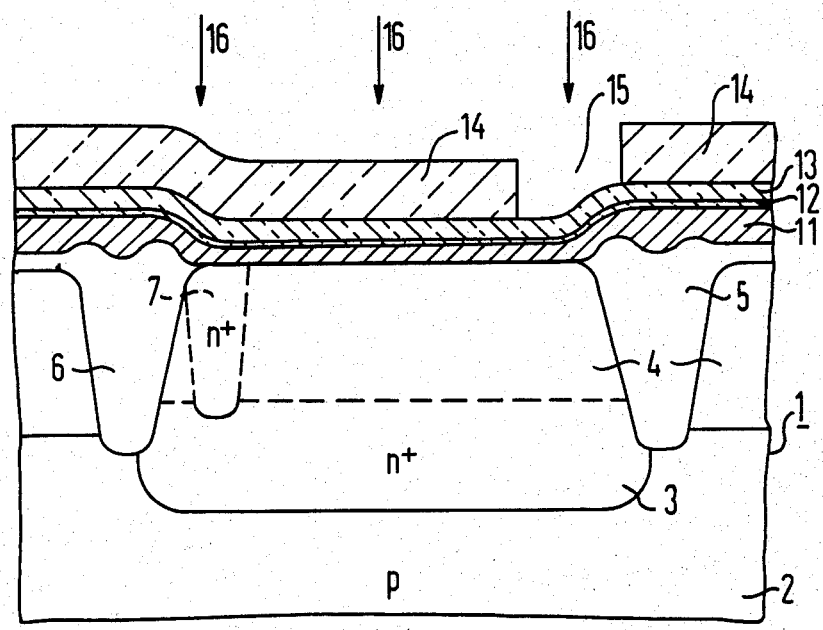
FIG. 2 is a view similar to FIG. 1 of a silicon semiconductor body to which a photo varnish mask with openings in the area of the base contacts is additionally applied.

FIG. 2 shows a semiconductor body 1 as described with reference to FIG. 1, in which a photo varnish layer 14 is deposited on the silicon nitride layer 13. In the photo varnish (or photoresist) layer 14, an opening 15 is made in the region of the intended base contacts by means of photolithographic processes. This opening 15 is somewhat larger than the base contact to be provided there in the transistor according to the invention. The arrows 16 indicate a boron implantation with a particle energy which does not penetrate the photoresist layer 14 but does penetrate the silicon nitride layer 13 and the silicon oxide layer 12. This boron implantation, after latter diffusion of the boron ions into the single crystal semiconductor underneath, has the effect that the outer base part of the bipolar transistor made accordingly has heavier doping than the inner base region and thus provides a minimal path resistance and at the same time a good blocking characteristic of the emitter-base diode.

Figure 3:
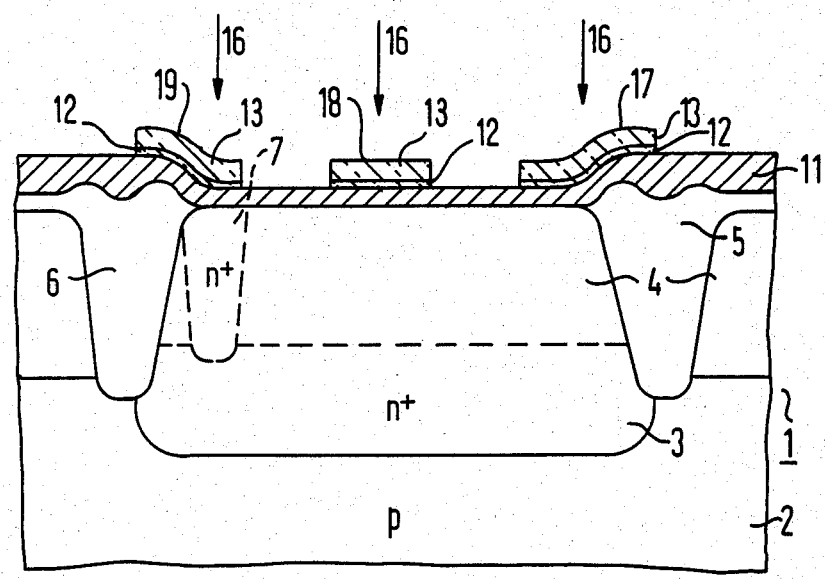
FIG. 3 is a view which is also similar to FIG. 1 of a semiconductor body in which the silicon nitride and silicon oxide layers are removed except for the region of the base, emitter and collector contacts.

FIG. 3 shows a semiconductor body corresponding to FIGS. 1 and 2. As compared to FIG. 2, the photoresist layer 14 has been removed and subsequently, the silicon nitride layer 13 and the silicon oxide layer 12 were removed by means of a photolithographic process except for the parts 17, 18, 19 where the base contacts, the emitter contacts and the collector contacts are to be formed in the later course of the process. Subsequently, a boron implantation, indicated by arrows 16, again takes place with a particle energy such that the exposed polysilicon layers are implanted with boron, while the semiconductor body itself and the polysilicon parts under the nitride layers are not subjected to boron implantation. This boron implantation in turn, after a temperature step following thereafter, causes doping of the outer base region of bipolar transistors manufactured in accordance therewith.

Figure 4:
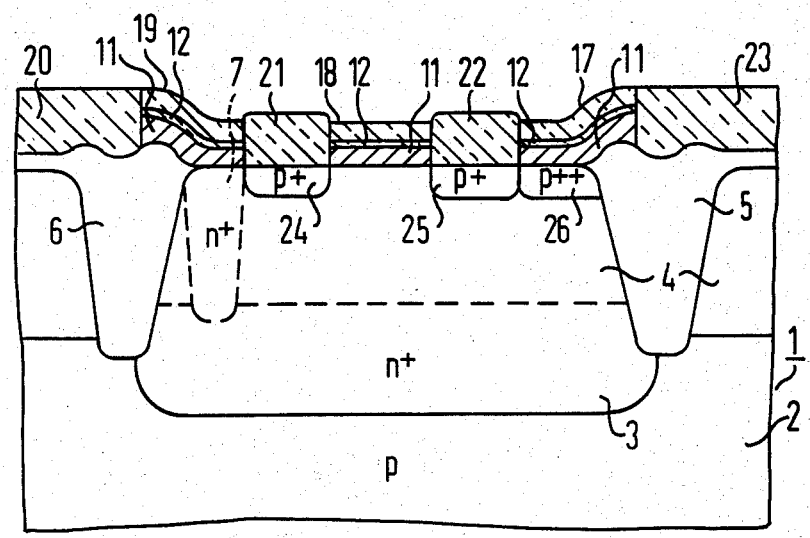
FIG. 4 is a view similar to FIG. 3 of a semiconductor body which was subjected to thermal oxidation.

FIG. 4 shows a semiconductor component according to FIG. 3, in which oxidation of the exposed polysilicon parts took place for the purpose of structuring, where the heat due to the oxidation at the same time causes diffusion of boron from the polysilicon layer 11 into the semiconductor layers underneath. The oxidation causes thick oxide structures 20, 21, 22 and 23 on the semiconductor surface. The regions 24, 25 and 26 indicate the diffusion of boron from the polysilicon into the semiconductor single crystal, and the symbols p+, pp++ indicate that the region 26 has heavier boron implantation than the regions 24 and 25.

Figure 5:
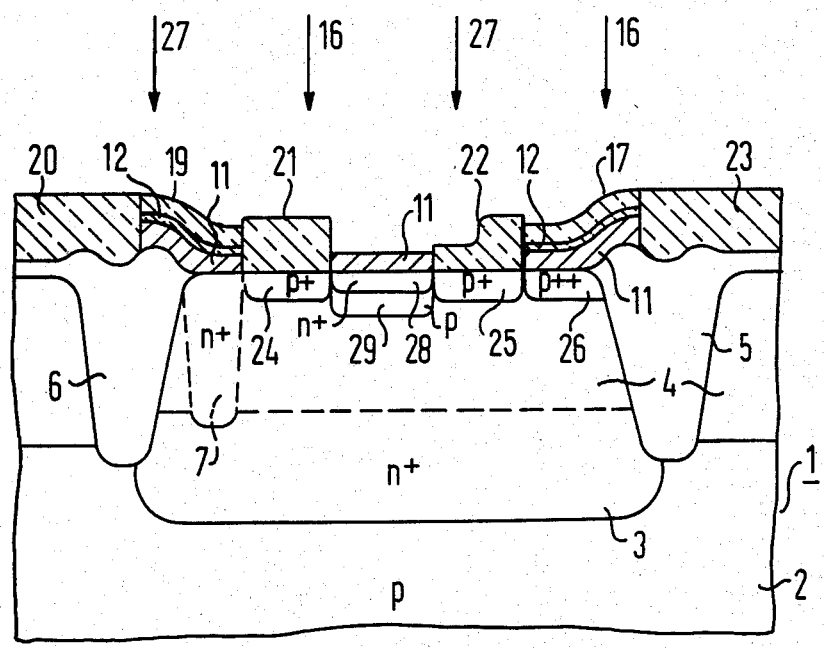
FIG. 5 is a view similar to FIG. 4 of a semiconductor body in which the silicon nitride and silicon oxide layers in the areas of the collector and emitter contact are removed.

In contrast to FIG. 4, the silicon nitride and silicon oxide layers have been removed in FIG. 5 by means of a repeated photo technique at the part 18, while these layers are preserved at the parts 17 and 19. At the intended base and emitter contact points, all layers are therefore removed down to the polysilicon layer, while the intended base contact continues to be covered by a silicon oxide layer 12 and a silicon nitride layer 17, 19. A subsequent boron implantation, indicated by arrows 16, and arsenic implantation indicated by arrows 27, enriches the polysilicon layer 11 in the part 18 with boron and arsenic, while the implantation energies are at the same time held so that they do not penetrate the silicon nitride layer 17, 19, and the silicon oxide layer 12 as well as the thick oxide layers 20, 21, 22 and 23. The implantations are further disposed so that the arsenic concentration is substantially higher than the boron concentration in those parts of the polysilicon layer 11 which are affected by the implantation. By means of thermal diffusion, the boron and arsenic ions brought into the exposed layers 11 are subsequently diffused into different regions of the semiconductor single crystal underneath, utilizing different diffusion velocities, so that the emitter zone 28 and the inner base region 29 are produced. Instead of a simultaneous boron and arsenic implantation, these implantations can also be separated in time and into different depths of the exposed polysilicon layer 11. In this way, especially flat inner base profiles and emitter profiles can be produced and especially small base widths can be set, so that accordingly, especially fast bipolar transistors can be fabricated.

To finish the accordingly fabricated bipolar transistors, emitter, base and collector contacts are attached to the doped polysilicon layers, after the contact locations have been opened.

Transistors according to the invention are not confined to the use of silicon. Rather, other suitable semiconductor materials can also be used. Furthermore, dopings can be disposed so that, contrary to the embodiment examples according to the drawing and the description, transistors are fabricated with regions having the doping thereof interchanged in mirror-fashion as to p- and n-conduction.

By using the method according to the invention, particularly fast bipolar transistors can be fabricated.

There are claimed:

1. Method for the manufacture of fast bipolar transistors, which comprises
applying an n-doped buried-layer diffusion layer over a p-doped silicon semiconductor substrate;
subsequently applying an n-doped epitaxially deposited silicon layer over the semiconductor body;
forming walls extending through the epitaxial layer into one of the buried-layer diffusion layer and the semiconductor substrate for insulating adjacent components;
creating a collector zone by placing n-doped collector diffusions into the epitaxially applied n-doped silicon layer which extend through the epitaxially applied layer into the buried-layer diffusion layer;
depositing, in sequence, an undoped polycrystalline layer, a silicon oxide layer and a silicon nitride layer on the surface of the semiconductor body at given locations where a transistor is to be produced;
selecting base contact locations of a given size; collector contact locations and emitter contact locations;
depositing a photo varnish or photoresist layer on the silicon nitride layer; etching windows which are larger than the given size into the photo-layer at the base contact locations by photolithography;

implanting boron with a particle energy which penetrates the silicon nitride and SiO2 layers down into the polycrystalline layer but does not penetrate the resist mask;

implanting boron again after removing the photo resist mask with a particle energy which implants the exposed parts of the polycrystalline layer with boron but does not implant the silicon body and the parts of the polycrystalline layer under the silicon nitride layer;

simultaneously with oxidizing the exposed parts except the base contact locations of the polycrystalline layer for structuring, diffusing boron from the polycrystalline layer into the layers therebelow by the heat caused by the oxidation; subsequently etching away the silicon nitride and silicon oxide layers at the emitter contact locations by another photo technique while preserving the nitride and oxide layers of the base and collector contact locations;

implanting boron and arsenic into the polycrystalline layers at the emitter contact locations with a substantially higher concentration of arsenic than boron, leaving a nitride mask in the base contact locations which is thick enough to keep arsenic ions away from the polycrystalline layer therebelow;

producing an inner base region and an emitter zone by bringing arsenic ions and boron ions from the polycrystalline layer into the silicon body by thermal diffusion; and opening contact points on the doped polycrystalline layers, and subsequently applying emitter, base and collector contacts.

2. Method according to claim 1, which comprises forming walls as pn-walls through epitaxial layer to form a trough with the semiconductor substrate.

3. Method according to claim 1, which comprises forming the walls out of insulating material.

4. Method for the manufacture of fast bipolar transistors, which comprises forming a collector trough by diffusion or implantation in a p-doped silicon semiconductor substrate:

depositing, in sequence, an undoped polycrystalline layer, a silicon oxide layer and a silicon nitride layer on the surface of the semiconductor body at given locations where a transistor is to be produced;

selecting base contact locations of a given size, collector contact locations and emitter contact locations;

depositing a photo varnish or photoresist layer on the silicon nitride layer; etching windows which are larger than the given size into the photo-layer at the base contact locations by photolithography;

implanting boron with a particle energy which penetrates the silicon nitride and silicon oxide layers down into the polycrystalline layer but does not penetrate the photo-layer;

at least partially removing the photo-layer; subsequently etching away the silicon nitride and silicon oxide layers by further photolithography except at the base, emitter and collector contact locations to at least partially expose the polycrystalline layer and leave the remaining parts thereof unexposed;

subsequently implanting boron again with a particle energy which implants the exposed parts of the polycrystalline layer with boron but does not implant the semiconductor body and the parts of the polycrystalline layer under the nitride oxide layer;

subsequently oxidizing the exposed parts except the base contact locations of the polycrystalline layer for structuring, and simultaneously diffusing boron from the polycrystalline layer into the semiconductor layers therebelow by the heat caused by the oxidation;

subsequently etching away the silicon nitride and silicon oxide layers at the emitter contact locations by another photo technique while preserving the nitride and oxide layers of the base and collector contact locations;

subsequently implanting boron and arsenic into the polycrystalline layers at the emitter contact locations with a substantially higher concentration of arsenic than boron, leaving a nitride mask in the base contact locations which is thick enough to keep arsenic ions away from the polycrystalline layer therebelow;

producing an inner base region and an emitter zone by bringing arsenic ions and boron ions from the polycrystalline layer into the semiconductor single crystal by thermal diffusion; and opening contact points on the doped polysilicon layers, and subsequently applying emitter, base and collector contacts.

5. Method for the manufacture of bipolar transistors, which comprises covering a surface region of a monocrystalline silicon body with an undoped polycrystalline layer, the surface region having the required doping for the collector of a transistor to be formed, covering the polycrystalline silicon layer with an SiO2 layer, covering the SiO2 layer with a silicon nitride layer, initially implanting the required doping material for doping an outer base laterally surrounding an emitter into the surface region of the monocrystalline silicon body, subsequently diffusing the required doping material for doping an inner base to be disposed below the emitter into the surface region of the monocrystalline silicon body, initially implanting the required doping material for doping a part of the outer base at a distance from the emitter of the transistor to be formed as a contact of the base in a first implantation process, and placing an implantation photo resist mask on the silicon nitride layer onto that part of the polycrystalline silicon layer disposed above the contact part to be formed, removing the photo resist mask as well as part of the silicon nitride layer covering the polycrystalline silicon layer above a remaining part of the outer base zone to be formed, leaving an exposed part of the polycrystalline layer and remaining parts of the silicon nitride layer, subsequently implanting the required doping material for the remaining part of the outer base into the exposed part of the polycrystalline silicon layer, a first remaining part of the silicon nitride layer covering the polycrystalline layer above a location provided for the emitter and the inner base in the surface region of the monocrystalline silicon body, using the first remaining part of the silicon nitride layer as an implantation mask for a second ion implantation process, preventing doping material from the polycrystalline silicon layer from entering the surface region of the monocrystalline silicon body below during the first and second ion implantation processes, finishing the second ion implantation process with a thermal oxidation process by using second remaining parts of the silicon nitride layer as an oxidation mask, subsequently oxidizing the exposed parts of the polycrystalline silicon layer, diffusing the doping material implanted into the polycrystalline silicon layer by forming the outer base into the surface region of the monocrystalline silicon body for diffusion, using the $SiO_2$ layer as an etching mask for the removal of the first remaining part of the silicon nitride layer covering the polycrystalline layer above the inner base to be formed during the oxidation process of the polycrystalline silicon layer, without altering the $SiO_2$ layer, and using the $SiO_2$ layer as a mask for the subsequent doping of the inner base and the emitter into the surface region of the monocrystalline silicon body, by means of the still undoped part of the polycrystalline silicon layer.

* * * * *